(12) United States Patent  (10) Patent No.: US 8,242,787 B2
Hente et al.  (45) Date of Patent: Aug. 14, 2012

(54) METHOD FOR DETERMINING A STATUS AND/OR CONDITION OF A LED/OLED DEVICE AND DIAGNOTIC DEVICE

(75) Inventors: Dirk Hente, Wuerselen (DE); Joseph Hendrik Anna Maria Jacobs, Eygelshoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 505 days.

(21) Appl. No.: 12/532,451

(22) PCT Filed: Mar. 27, 2008

(86) PCT No.: PCT/IB2008/051137
§ 371 (c)(1),
(2), (4) Date: Sep. 22, 2009

(87) PCT Pub. No.: WO2008/120143
PCT Pub. Date: Oct. 9, 2008

(65) Prior Publication Data
US 2010/0066375 A1  Mar. 18, 2010

(30) Foreign Application Priority Data
Mar. 30, 2007 (EP) .................. 07105302

(51) Int. Cl.
*G01R 31/02* (2006.01)
(52) U.S. Cl. .............. 324/537; 324/754.07; 324/500
(58) Field of Classification Search .............. None
See application file for complete search history.

(56) References Cited

U.S. PATENT DOCUMENTS

| | | | |
|---|---|---|---|
| 6,350,978 B1 | 2/2002 | Kasai | |
| 6,473,065 B1 | 10/2002 | Fan | |
| 7,391,335 B2 * | 6/2008 | Mubaslat et al. | 340/657 |
| 7,880,476 B1 * | 2/2011 | McKenzie et al. | 324/543 |
| 2005/0062481 A1 | 3/2005 | Vaughn et al. | |
| 2006/0016959 A1 | 1/2006 | Nishimura | |
| 2006/0077136 A1 | 4/2006 | Cok | |

FOREIGN PATENT DOCUMENTS
WO  2007022409 A2  2/2007

OTHER PUBLICATIONS

Kim et al., "Impedance spectroscopy of a poly (p-phenylenevinylene)-based light-emitting diode device", Solid State Communications, 2003, pp. 143-146.
Ono et al., "Electrical properties of organic light emitting diodes (OLEDs) studied by impedance spectroscopy in ultra high vacuum", Organic Light-Emitting Materials and Devices IV, Proceedings of SPIE vol. 4105 (2001), pp. 299-206.

* cited by examiner

*Primary Examiner* — Jermele M Hollington
*Assistant Examiner* — Trung Nguyen
(74) *Attorney, Agent, or Firm* — Mark L. Beloborodov

(57) ABSTRACT

The present invention relates to a method for determining a status and/or condition of an LED/OLED device 10, comprising the steps of: applying at least one time varying signal 22 to the LED/OLED device, acquiring the response 24 to said at least one time varying signal, correlating said response with predetermined values 30, and determining the status/condition 32 on the basis of the correlation result. Further, the present invention relates to a device adapted to carry out the inventive method.

15 Claims, 12 Drawing Sheets

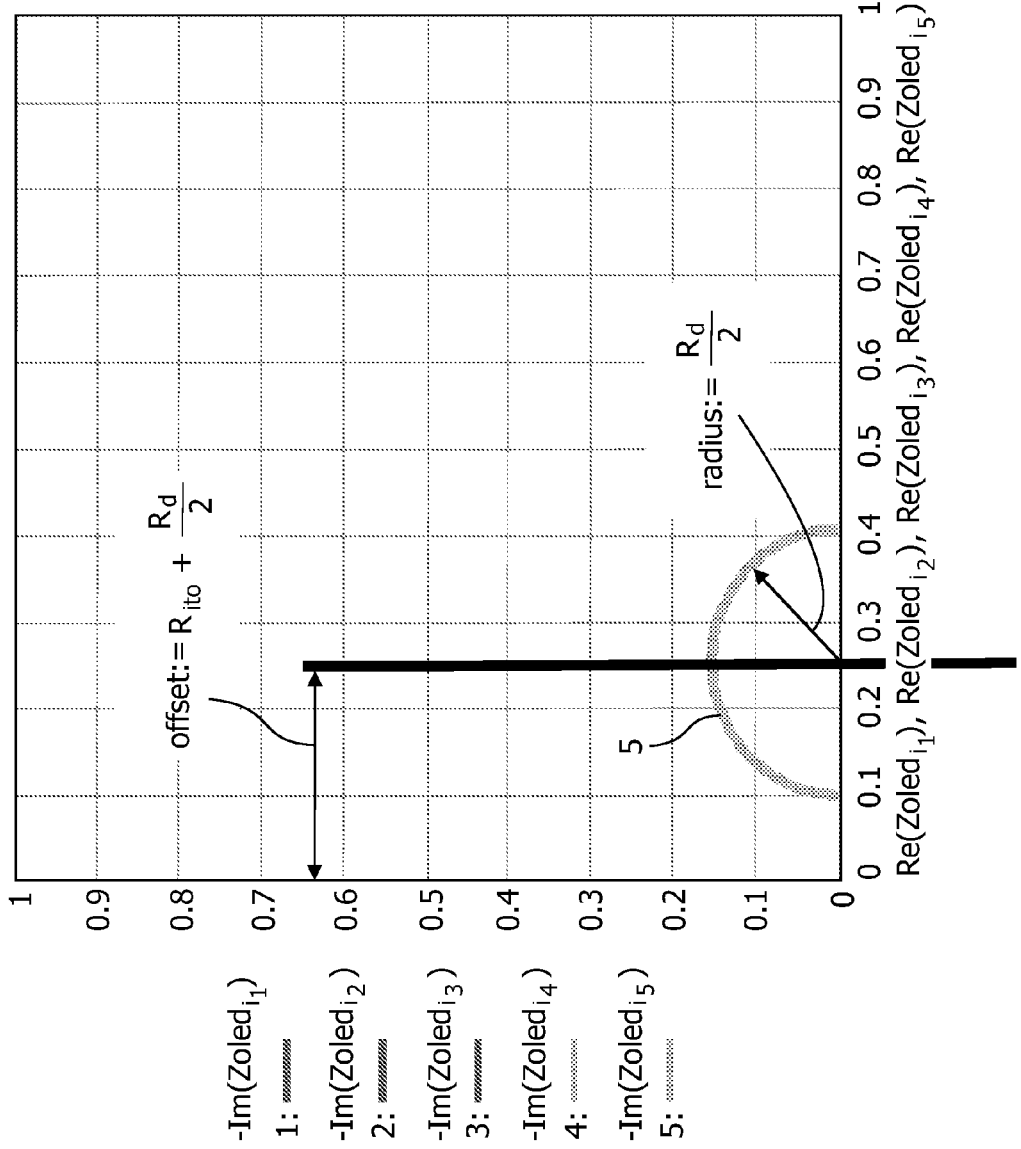
FIG. 9-I

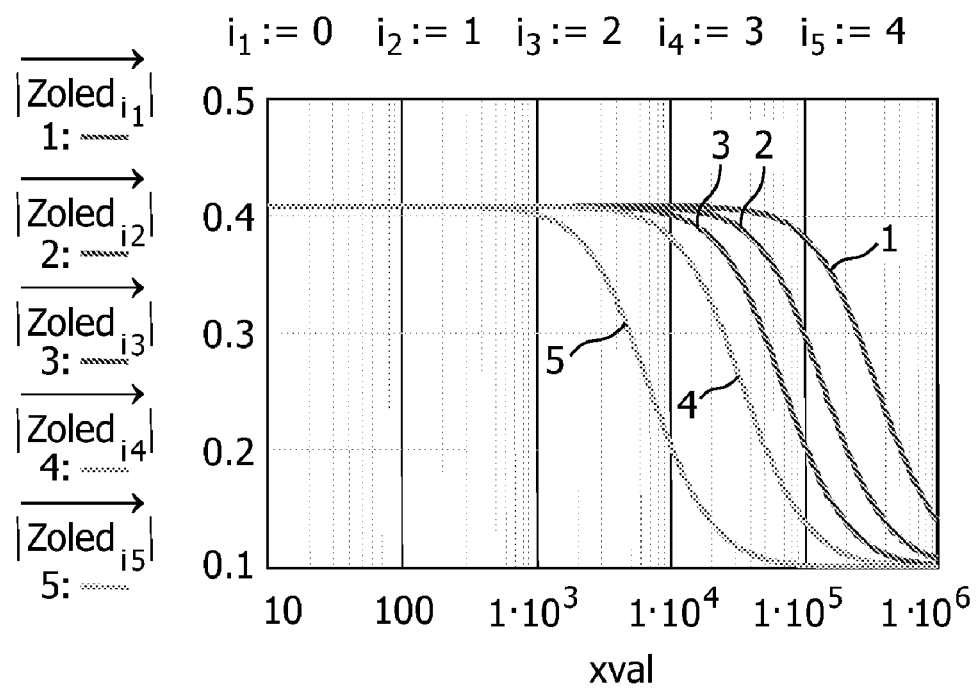
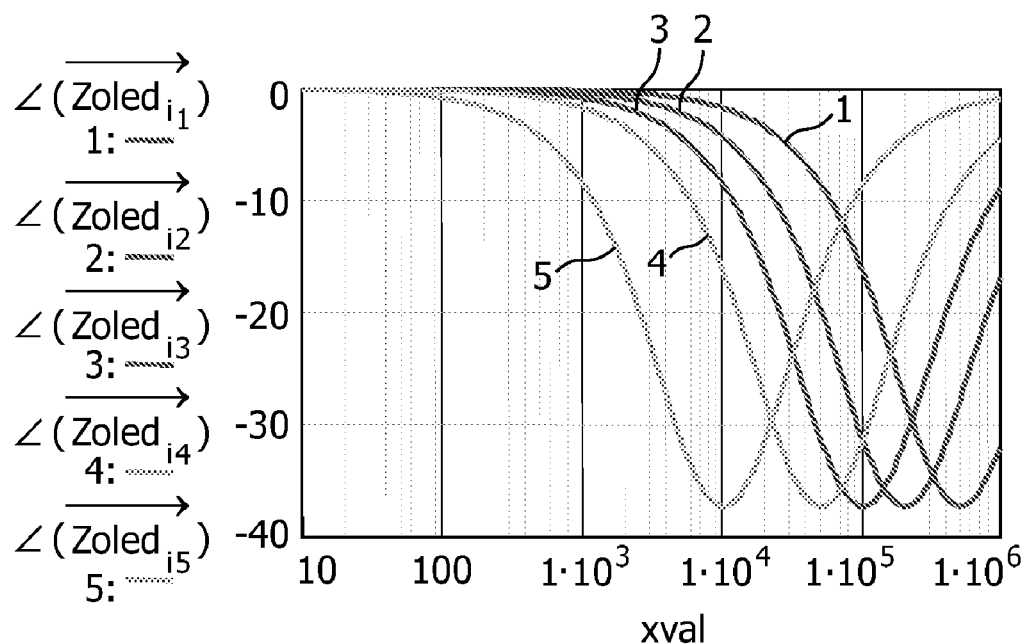
FIG. 9-II

METHOD FOR DETERMINING A STATUS AND/OR CONDITION OF A LED/OLED DEVICE AND DIAGNOTIC DEVICE

FIELD OF THE INVENTION

The present invention relates to a method for determining a status and/or condition of a LED/OLED device. Further, the invention also relates to a diagnostic device for determining a status and/or condition of a LED/OLED unit.

BACKGROUND OF THE INVENTION

LED and OLED devices become more and more popular as lighting elements not only in the technical application fields but also in private home application fields. Irrespective of the application, it is always desired that the LED/OLED devices radiate light with the same intensity even over long periods. Due to aging effects, particularly with OLED devices, the light output decreases without compensation. Therefore, it is necessary to compensate for the aging so as to keep the light output constant.

Further, it is also desired that the driver circuit for supplying power to the LED/OLED devices may be operated to assure constant light output independent of the size of the LED/OLED device. For example, OLED luminaries with a different number of tiles require the adjustment of the OLED current. In other words, the driver circuit should be scalable.

For convenient use in the home environment, it is desired to carry out these operations automatically. The user should not have to perform any control or adjusting.

Prior art techniques have utilized simple static measurements delivering only one parameter for determining a status or condition of a LED/OLED device for compensating aging, etc. This parameter is, for example, forward voltage or slope of the IV-curve or an impedance value.

Static measurements are prone to electrical noise and interference under field conditions. To reduce interference during parameter detection filtering can be used. This, however, is quite expensive because the size of passive components scale with frequency and are most expensive for DC. Moreover, static measurements derive differential characteristics from the difference of two (or more) large signal operating points. A very unreliable procedure.

Further limitations and issues of prior art appear when more than one OLED parameter has to be determined such as the size of an OLED. To determine the size with static measurements parameters of the non-linear IV-characteristic will be used as a measure. Assuming a specific IV-characteristic $$i = a \cdot (v - v_f)^b$$

the gain factor "a" is a measure for the size of the OLED for a given vf, b. In the following, two examples will be given to determine the gain factor "a", wherein in the first case vf and b are known, and in the second case vf is unknown as well.

To determine gain "a", the OLED is driven with a test current Im, which must be low enough to avoid a destruction of the OLED. Then the voltage across the OLED vm is measured. Now the gain can be calculated:

$$a = \frac{i_m}{(v_m - v_f)^b}$$

This method works quite easy, requires, however, the knowledge of the OLED characteristic b and the forward voltage vf. It is, however, the forward voltage which depends strongly on the temperature, so that it is necessary for an increased accuracy to treat vf as unknown as well, so that an additional measurement has to be done.

In the second case, there are two unknowns, so that at least two measurements have to be made:

$$i_1 = a \cdot (v_1 - v_f)^b$$

$$i_2 = a \cdot (v_2 - v_f)^b$$

Solving these two equations for vf and a gives:

$$a = \left[ \frac{v_2 - v_1}{\left(\frac{i_2}{i_1}\right)^{\frac{1}{b}} - 1} \right]^{-b} \cdot i_1$$

$$v_f = i_2^{\frac{1}{b}} \cdot \frac{v_1 - v_2}{i_2^{\frac{1}{b}} - i_1^{\frac{1}{b}}} + v_2$$

It is obvious that this method can be extended to many more OLED parameters in order to characterize the various OLEDs of a certain family. The problem is, however, that the underlying equations become non-linear. The form of equations itself of device dependent so that there is no simple standardized procedure to determine OLEDs' parameters. In effect, static measurements are typically limited to determine one single parameter. Moreover, static measurements are prone to electrical noise and interference. Filtering is quite expensive because the size of passive components scale with frequency and are most expensive for DC. Moreover, static measurements derive differential characteristics from the difference of two (or more) large signal operating points. A numerically noisy procedure.

SUMMARY OF THE INVENTION

In view of the above it is an object of the present invention to provide a method and a device for determining a status and/or condition of an LED/OLED device which allows to extend the determination of more than one parameter of the LED/OLED device compared with static measurements. A further object of the present invention is to allow an automatic operation of the method.

These and other objects are solved by a method comprising the steps of:
applying at least one time varying signal to the LED/OLED device,
acquiring the response to said at least one time varying signal,
correlating said response with predetermined values, and
determining the status/condition on the basis of the correlation result.

In a preferred embodiment, the method comprises the steps of:
applying a set of time varying signals to the LED/OLED device;
acquiring the response to said signals;
determining impedance values of said device on the basis of the response;
matching the impedance values to predetermined model values of an equivalent circuit network of said LED/OLED device, such that the impedance of the circuit network corresponds to the determined impedance value, and
determining the circuit elements of the matched equivalent circuit network on the basis of which the status and/or condition being determined.

The inventive method allows the extension to many more LED/OLED parameters compared to static measurements. And what is more important, the method can be automated.

The general idea of the inventive method is to make use of small signal measurements where the response of the LED/OLED device is used to determine the circuit elements of an LED/OLED model. The circuit elements can be correlated to characteristics, such as light efficiency, temperature, aging, effects, size, type, etc. of the LED/OLED.

According to the preferred embodiment, the present invention makes use of the fact that an LED/OLED device, particularly its electrical behavior, may be modeled based on an equivalent electrical circuit network. Some or all elements of this network have a physical meaning corresponding to the LED/OLED parameters to be determined. Once the network elements are known, the LED/OLED properties are known as well.

For example, an OLED model is a simple three element network comprising a resistance and in series a capacitance parallel to a diode.

The value of the capacitance is for example a measure for the size of a non defective OLED or the size/number of extrinsic defects. The slope of the IV curve over the diode is a measure for the aging, intrinsic defects (for a known size). Further, the IV curve parameters are a measure for the type of the OLED, its size and the temperature.

To determine the circuit elements of the equivalent electric circuit network and the parameters, the complex impedance of the LED/OLED device is measured for a set of discrete frequencies. Once these impedance values are known, the circuit elements are determined in such a way that the impedance of the equivalent electric circuit network corresponds to the set of measured impedance values. This matching can be done by well-known mathematical methods.

The time varying signals are preferably selected out of the group of: sinusoidal signals, chirp signals, wideband signals, smallband signals, single frequency signals, multi frequency signals, step signal or ramp signals.

It is to be noted, that other signals may also be used provided that they are not pure DC signals. It is important, that the signals applied to the LED/OLED device vary with time which is necessary to determine the impedance of the equivalent circuit network.

The method according to the present invention allows to determine the light efficiency or the number of defects of the LED/OLED device as a status. Further, the inventive method could be used to determine the aging in relation to expected lifetime, the expected lifetime, the type, the size or overheating as a condition of an LED/OLED device.

The object of the present invention is also solved by a diagnostic device for determining a status and/or condition of an LED/OLED unit, the diagnostic device comprising first means for generating a set of time varying signals and applying them to the LED/OLED unit;

second means for acquiring the response to said applied signals;

third means for correlating said response with predetermined values; and fourth means for determining the status and/or condition on the basis of the correlation result.

Preferably, the third means of the diagnostic device comprises means for determining impedance values of said device on the basis of the response, and means for matching the impedance values to predetermined model values of an equivalent circuit network of said LED/OLED device, such that the impedance of the circuit network corresponds to the determined impedance value, wherein said fourth means determine the circuit elements of the matched equivalent circuit network, on the basis of which the status and/or condition being determined.

This inventive diagnostic device allows to perform the inventive method as described above. The diagnostic device allows to realize the same advantages set forth above. Particularly, it is possible to automatically determine a status and/or condition, for example light efficiency, number of defects, aging, expected lifetime, overheat, type, size, etc. of the LED/OLED unit during operation of the LED/OLED unit. The user of the LED/OLED unit will not recognize the operation of the diagnostic device since the applied time varying signals are very small and hence do not result in an illumination of the LED/OLED unit.

With the inventive diagnostic device, it is possible to determine not only one parameter, like aging, light efficiency, etc., making an adjustment during operation of the LED/OLED unit possible. Hence, it is for example possible to compensate for aging effects during lifetime of the LED/OLED unit.

In a preferred embodiment, the diagnostic device is integrated into the LED/OLED unit. However, it is to be noted that the diagnostic device may also be provided as a separate part.

Further features and advantages can be taken from the following description and the enclosed drawings.

It is to be understood that the features mentioned above and those yet to be explained below can be used not only in the respective combinations indicated, but also in other combinations or in isolation, without leaving the scope of the present invention.

Embodiments of the invention are shown in the drawings and will be explained in more detail in the description below with reference to the same. In the drawings:

BRIEF DESCRIPTION OF THE DRAWINGS

FIG. 9 are schematic diagrams illustrating the relation between the radius and offset in a cole-cole impedance plot and OLED ito resistance $R_{ito}$ and slope of IV characteristic Rd;

DETAILED DESCRIPTION OF EMBODIMENTS

Figure 1:
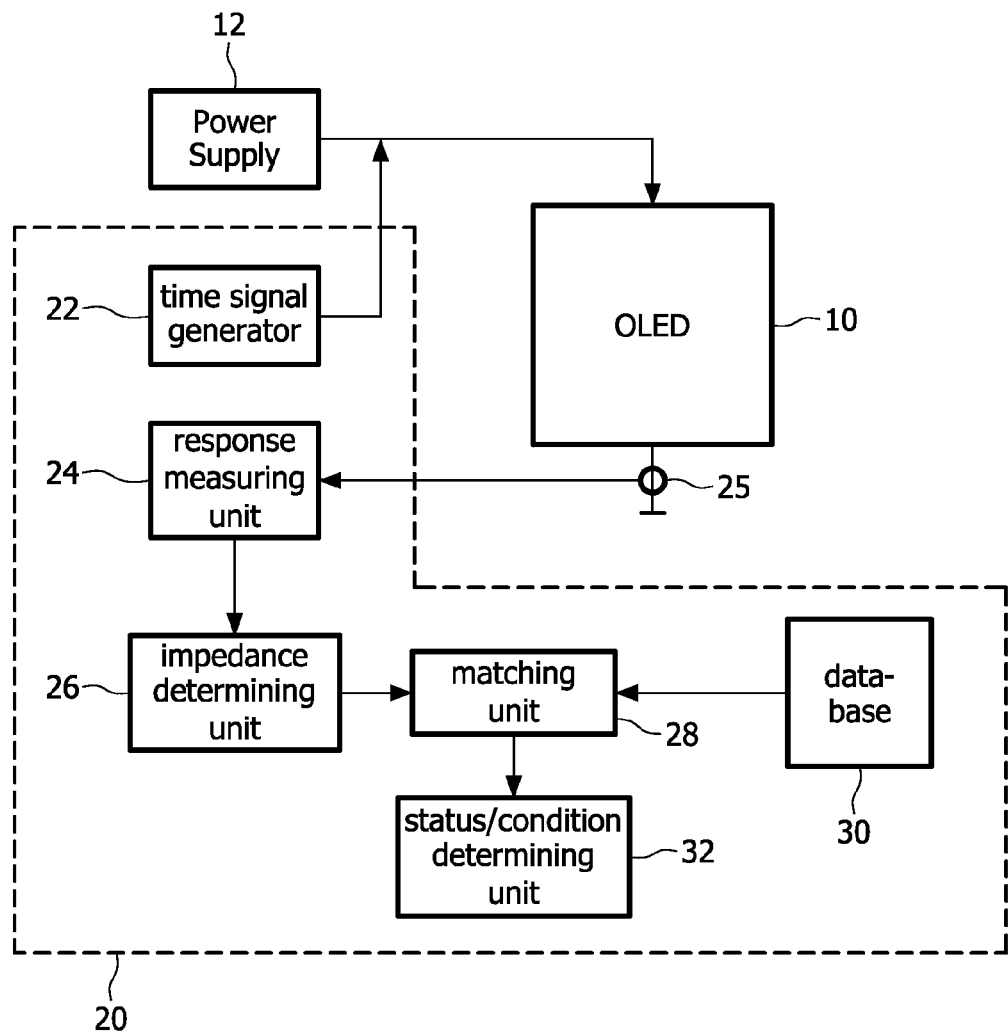
FIG. 1 is a schematic block diagram of an inventive diagnostic device and an OLED unit.

In FIG. 1 a schematic block diagram of a diagnostic device for determining a status and/or condition of an OLED unit 10 is shown and indicated with reference numeral 20. It is to be noted that the diagnostic device 20 is shown and used just for illustrative purposes and it is not intended to limit the inventive concept to the structure of this device 20.

The diagnostic device 20 may be part of the OLED unit 10 or may be provided separately. The OLED (organic light emitting diode) unit 10 may be provided as a unit comprising one or more organic light emitting diode tiles which may be driven commonly or independently from each other. It is to be noted that although the diagnostic device 20 of the present embodiment operates with an OLED device 10, the OLED unit 10 may also be replaced with an LED unit or a combination of both light emitting diode types.

The OLED 10 is connected with a power supply 12, which at least serves as a driver for driving the OLED 10. The power supply 12 may be connected to the mains voltage or may comprise batteries or accumulators for providing power.

The diagnostic device 20 comprises a time signal generator 22 which is adapted to generate time varying signals, the voltage level of which being selected such that the operation of the OLED is not influenced thereby. The time varying signals are added or superimposed to the power voltage supplied to the OLED 10.

The diagnostic device 20 further comprises a response measuring unit 24 which is coupled to the OLED 10 and adapted to measure the response signals to the supplied time varying signals. For example, in a supply line of the OLED, particularly in the line coupled with ground, a current measuring probe 25 is provided and coupled with a signal input of the response measuring unit 24. However, it is to be noted that the current measuring probe 25 is just one example of different probes appropriate for measuring response signals.

The diagnostic device 20 further comprises an impedance determining unit 26 receiving measuring signals from the response measuring unit and supplying impedance values to a matching unit 28. The matching unit 28 in turn is coupled with a database 30 and with a status/condition determining unit 32.

Figure 2A:
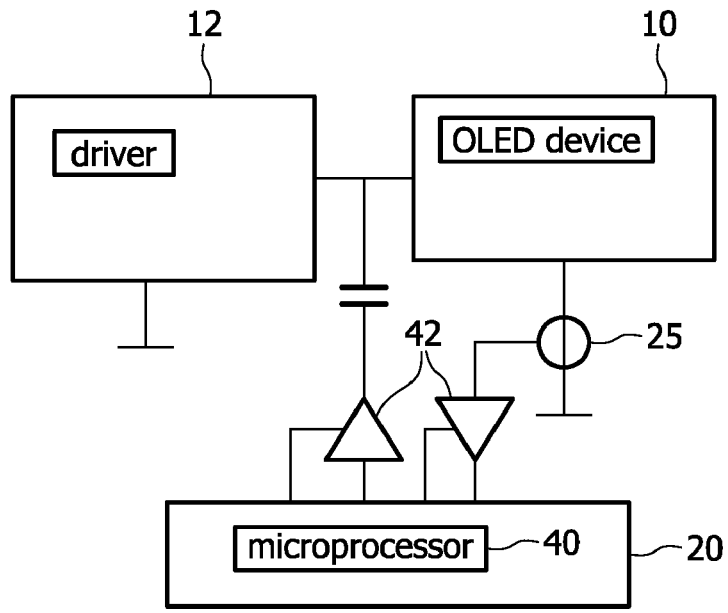
FIGS. 2a and 2b are schematic block diagrams illustrating two different designs of a diagnostic device coupled with an OLED device.
Figure 2B:
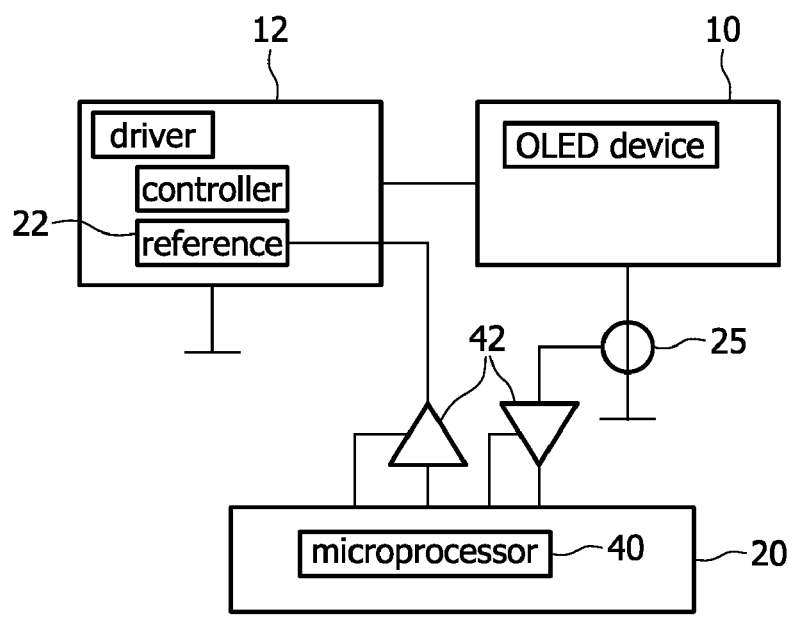

As shown in FIGS. 2a and 2b, the diagnostic device 20 may be provided as a microprocessor 40 incorporating the time signal generator 22, the response measuring unit 24, the impedance determining unit 26, the matching unit 28, and the status/condition determining unit 32. Optionally, the microprocessor 40 may also incorporate the database 30. However, this database 30 may also be provided separately.

In FIG. 2a it is indicated that the signal supplied to the OLED 10 and the measuring signal delivered by the probe 25 are both amplified by driver amplifiers 42.

In FIG. 2b, an alternative of the afore-mentioned embodiment is shown. In contrast to the afore-mentioned case, here the microprocessor 40 does not incorporate the time signal generator 22. Rather, this circuit 22 is part of the power supply 12. Nevertheless, both embodiments operate in the same manner which will be described in detail below.

Figure 3:
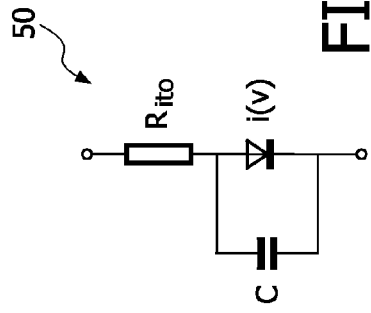
FIG. 3 shows a block diagram of an equivalent electrical circuit of an OLED unit.

The operation of the diagnostic device 20 bases on the idea that the electrical OLED behavior may be modeled based on an electrical equivalent network. Some or all elements of this network have a physical meaning corresponding to the OLED parameters to be determined. Once the network elements are known, the OLED properties are known as well. A typical example for an OLED model is a simple 3-element network as shown in FIG. 3. This equivalent electrical circuit network 50 comprises a resistance $R_{ito}$ representing the resistance of the ito-electrode of the OLED. In series to the resistance is a parallel connection of a capacitance C and a diode.

Assuming this electrical equivalent circuit 50, the capacitance C is a measure for the size of a non-defective OLED, and/or the size/No. of extrinsic defects. Further, the slope of the current voltage (IV) curve I(V) is a measure for the aging of the OLED and the intrinsic defects (for a known size). Moreover, the IV curve parameters are a measure for the type of the OLED, its size and the temperature. Hence, it is the main object of the diagnostic device 10 to determine the circuit elements of the equivalent electrical circuit and then to conclude the status/condition of the OLED from the circuit elements.

In the context of the present invention, status means e.g. light efficiency, i.e. LO/I or measure of number of defects, size or type of the OLED. "Condition" means aging in relation to expected life time or expected life time or temperature/overhead of the OLED.

As to determine the circuit elements, the diagnostic device measures the complex impedance of the OLED 10 for a set of a discrete frequencies using time varying signals supplied to the OLED and response signals supplied by the current measuring probe 25. Once these impedance values are known the circuit elements are determined in such a way that the impedance of the equivalent network corresponds to the set of measured impedance values. In other words, the complex impedance values determined are compared with impedance values stored in a database and belonging to given circuit elements. Hence, the database comprises a plurality of complex impedance values determined for the set of discrete frequencies and for a plurality of different circuit elements of the equivalent electrical circuit network.

The matching, that is looking for the best match of impedance values in the database, can be done by well-known mathematical methods. Various examples will be given below.

In a first example the parameters are derived from asymptotic analysis of the OLED impedance behavior.

To determine slope and capacitance an impedance measurement can be used. This is done by injecting a small ac-signal with frequency fm and known current amplitude Im. The OLED voltage vm is measured and the complex impedance values can be calculated: Zm=Vm/Im. Repeating this measurement for various DC operating points a set of impedance values Z1, Z2, . . . can be calculated.

Figure 6:
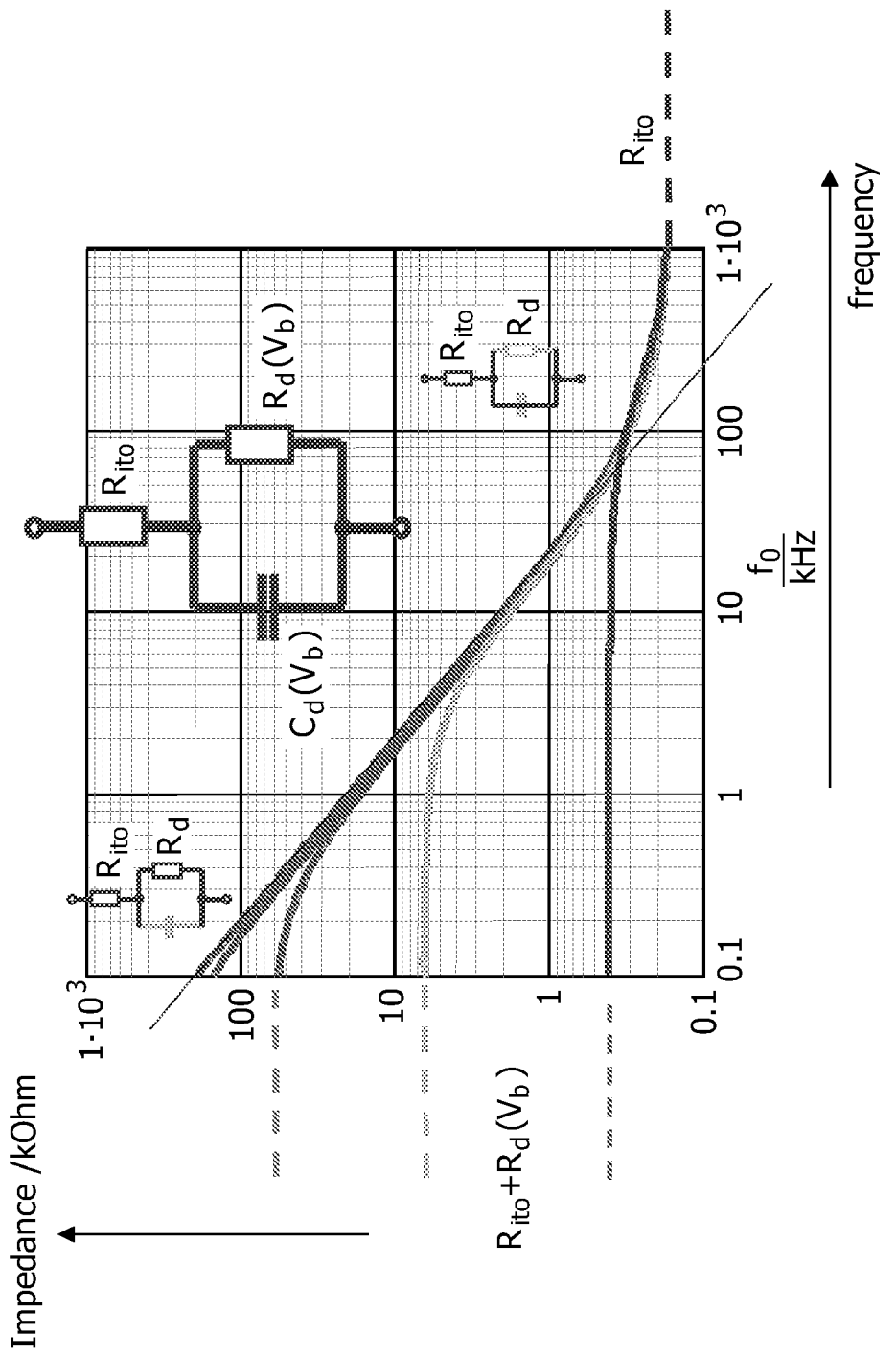
FIG. 6 is a diagram showing the impedance behavior model as a bias dependant (Vb) three element circuit.
Figure 7:
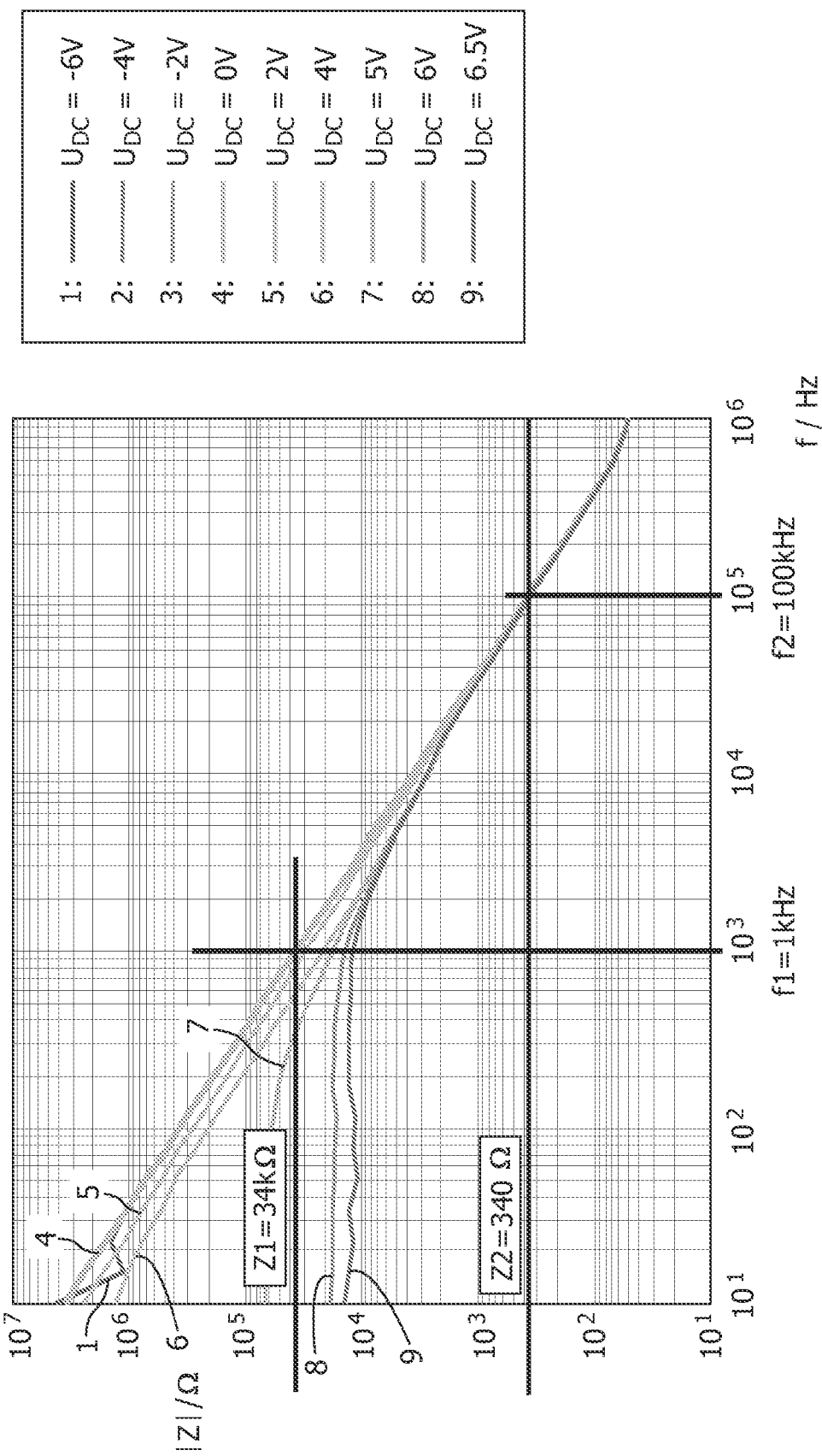
FIG. 7 is a schematic diagram illustrating the calculation of OLED self capacitance at bias point Vb=Udc=0V with sample measurements at either f1 or f2.
Figure 8:
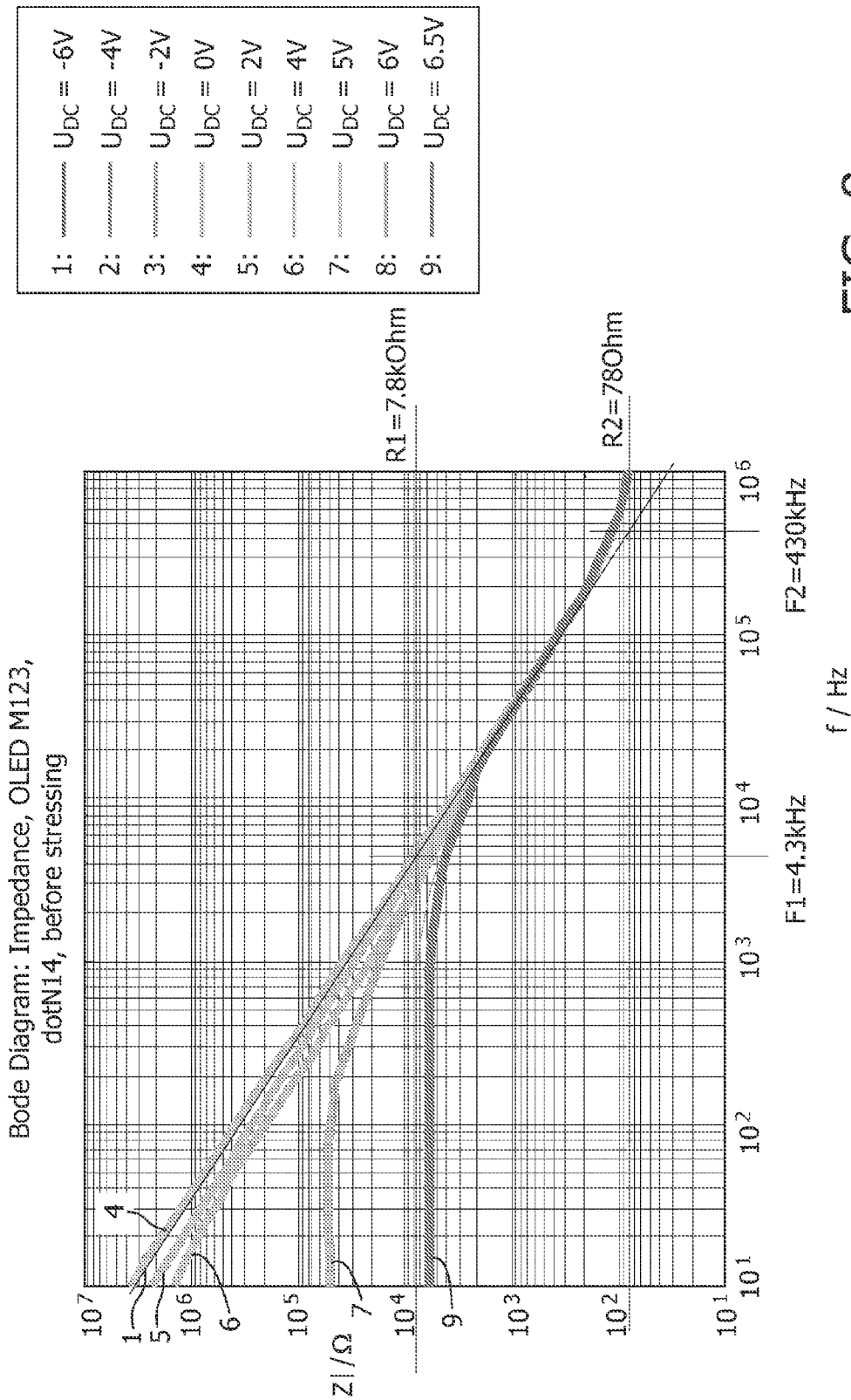
FIG. 8 is a schematic diagram illustrating the calculation of self capacitance Cd and ito resistance $R_{ito}$ by sample measurements at two frequencies f1 and f2.

The OLED circuit elements can be easily related to a small number of measurement values by asymptotic analysis. This is shown in picture FIG. 6 where the impedance plot is shown for various operating points.

Qualitatively the impedance curves can be fitted asymptotically by straight lines and correlated to the circuit elements:

$$Z(f) = \frac{R_{ito} + i \cdot R_{ito} \cdot \omega \cdot C_d \cdot R_d + R_d}{1 + i \cdot \omega \cdot C_d \cdot R_d}$$

$$= (R_{ito} + R_d) \cdot \frac{1 + j \cdot \omega \cdot \frac{C_d \cdot R_d \cdot R_{ito}}{R_d + R_{ito}}}{1 + j \cdot \omega \cdot C_d \cdot R_d}$$

$$= Z_o \cdot \frac{1 + j \cdot \frac{f}{f_1}}{1 + j \cdot \frac{f}{f_2}}$$

-continued $$Z_{low} = R_{ito} + R_d, f \ll f1, f_1 = R_{d\_ito} \cdot C_d$$

$$Z_{high} = R_{ito}, f \gg f2, f_2 = C_d \cdot R_d$$

For example for operating voltages below forward voltage vf the OLED device shows a capacitive behavior. The impedance plot is a straight line. A single measurement would be sufficient to determine the OLED capacitance via the relation:

$$Cd=1/(2*pi*f*Zm).$$

In the presented example the OLED impedance is Z1=34 kOhms @ 1 kHz. The resulting capacitance is Cd=4.7 nF.

Figure 4:
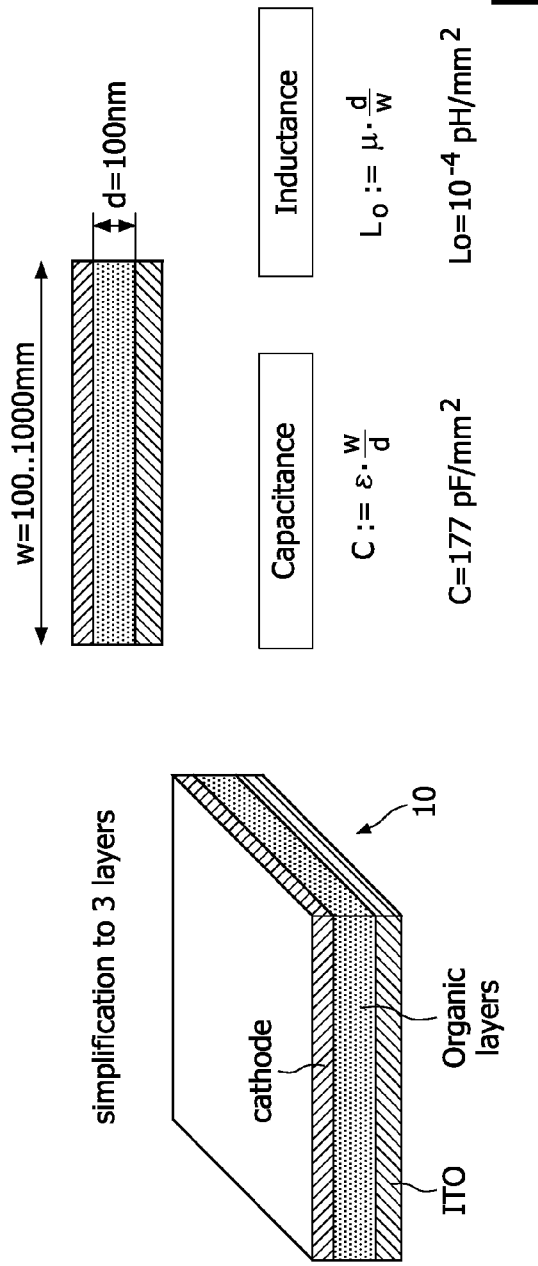
FIG. 4 schematically shows the general structure of an OLED unit and the formula to determine its capacitance and inductance.

Another measurement e.g. taken at f2=100 KHz with an impedance value of Z2=340 Hz would the same capacitance of Cd=4.7 nF. This way, several measurements can be made at different frequencies to increase redundancy to estimate the self capacitance of the OLED. Once the self capacitance is known, the size is known as well. To calculate the size a simple parallel plate capacitor formulae is used, as shown in FIG. 4.

Figure 12:
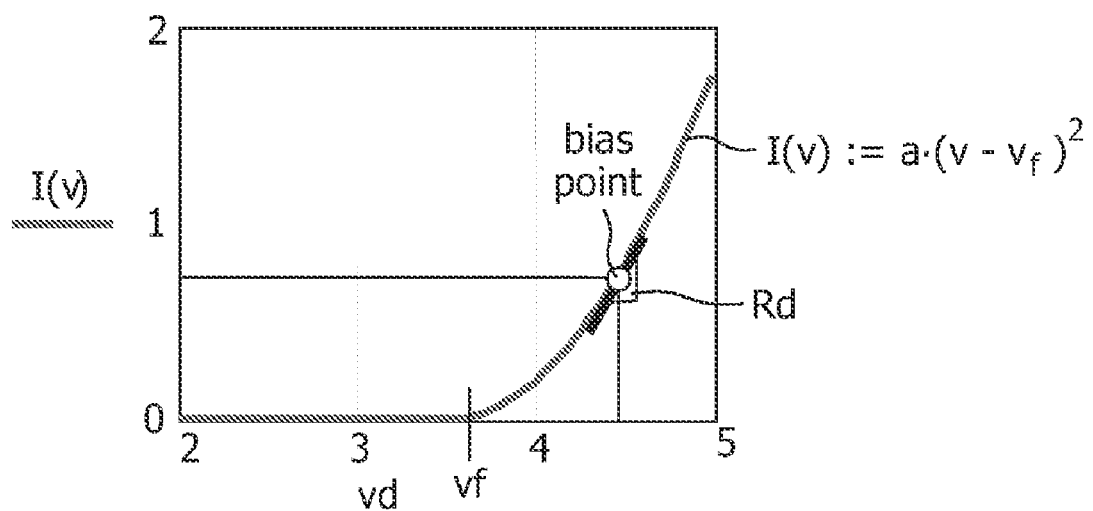
FIG. 12 shows a diagram illustrating the static OLED characteristic.

The slope of the IV-curve, as shown in FIG. 12—represented by the impedance Rd—for a given operating point corresponds to the horizontal line in the impedance plot, assuming a small ito resistance. It should be noted that the ito-resistance can be determined from a single impedance measurement at a high frequency above the second corner frequency.

This simple example shows that three parameters can be easily derived from three impedance measurements and applying simple formulas. It is of course necessary to improve robustness under field conditions to increase the number of measurements, i.e. to correlate the measured impedance values to—in the present case e.g.—slope and offset of straight lines.

In a second example the parameters are derived from the low pass behavior (corner frequency f1) of the OLED impedance.

$$Z(f) = \frac{R_{ito} + i \cdot R_{ito} \cdot \omega \cdot C_d \cdot R_d + R_d}{1 + i \cdot \omega \cdot C_d \cdot R_d}$$

$$= (R_{ito} + R_d) \cdot \frac{1 + j \cdot \omega \cdot \frac{C_d \cdot R_d \cdot R_{ito}}{R_d + R_{ito}}}{1 + j \cdot \omega \cdot C_d \cdot R_d}$$

$$= Z_o \cdot \frac{1 + j \cdot \frac{f}{f_1}}{1 + j \cdot \frac{f}{f_2}}$$

$$Z_{low} = R_{ito} + R_d, f \ll f1, f_1 = R_{d\_ito} \cdot C_d$$

$$Z_{high} = R_{ito}, f \gg f2, f_2 = C_d \cdot R_d$$

In a third example the parameters are derived from the geometric parameters (radius and offset) of a cole-cole plot of the OLED-impedance.

A cole-cole plot of the OLED impedance is depicted in FIG. 9 for an OLED family with 5 different capacitance values. The corresponding impedance plots (phase and magnitude) are shown as well. The impedance plots demonstrate the effect of a varying self capacitance of the OLED: both corner frequencies are shifted to higher frequencies for smaller self capacitance, i.e. OLEDs of smaller area. It is interesting to see that in the cole-cole plot the resulting OLED characteristic can be approximated by a circle with a specific radius and offset. Both values are independent of the self capacitance. This can be proven analytically as well:

$$\text{offset} := R_{ito} + R_d/2 \quad \text{radius} := R_d/2$$

What has been shown so far for a simple 3-element model can be extended to higher-order models as well. In general the small signal response of an OLED for a given DC-operating point can be described by a rational polynomial of order (n,m) for the nominator and denominator respectively:

$$Z(\omega) = \frac{b_0 \cdot \omega^0 + b_1 \cdot \omega^1 + b_2 \cdot \omega^2 + \ldots + b_n \cdot \omega^n}{a_0 \cdot \omega^0 + a_1 \cdot \omega^1 + a_2 \cdot \omega^2 + \ldots + a_m \cdot \omega^m}$$

Figure 10:
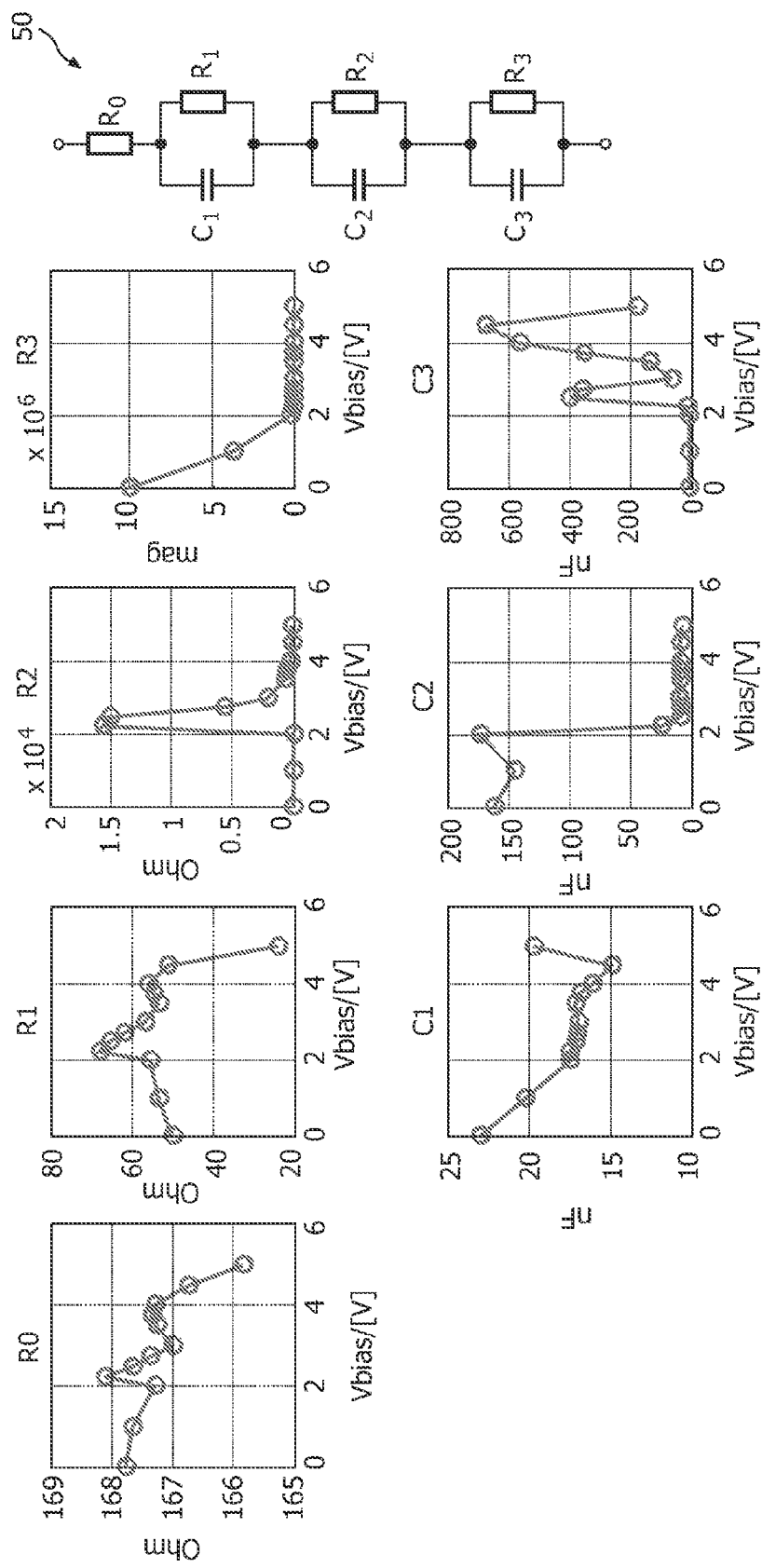
FIG. 10 shows diagrams illustrating the third order small signal non-linear OLED model, particularly the voltage dependency of circuit elements and the equivalent network on the right-hand side.

A special case is shown for a (3,3) model in FIG. 10.

Figure 11:
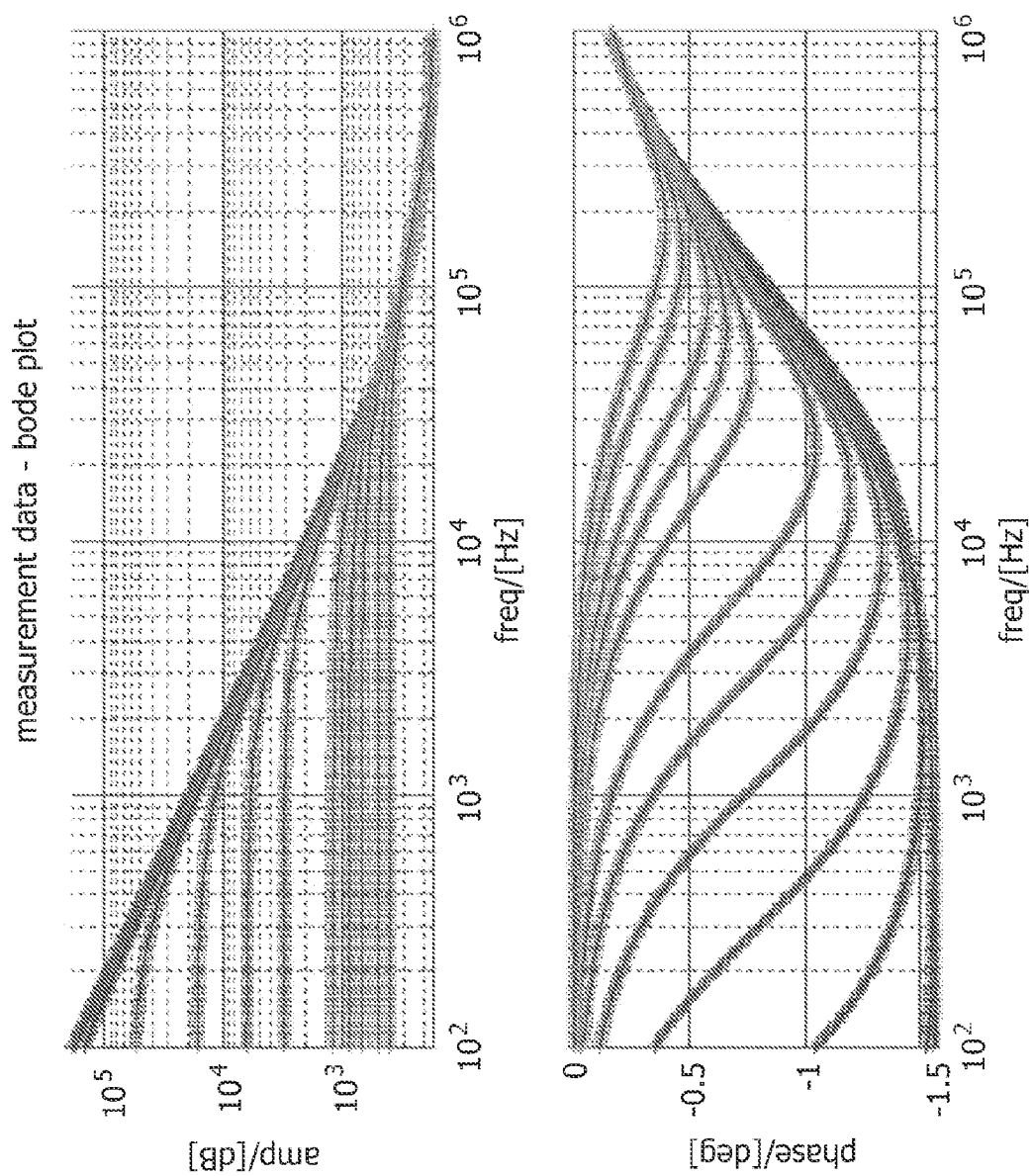
FIG. 11 shows an impedance plot for magnitude and phase: measurement vs model data (line) of the model shown in FIG. 10.

The modeling, i.e. matching of the measured impedance behavior by a rational polynomial function can be done by well-known methods. The result is shown is in FIG. 11, where the OLED impedance behavior is described over a wide range of frequency to a high degree of accuracy. This allows a very good characterization of the OLED.

After the OLED model parameters have been determined a correlation has to be done between the parameters and the desired OLED properties. An example is the OLED self capacitance and the OLED size.

OLEDs itself behave like a parallel capacitor especially when the applied voltage is below forward voltage as shown in FIG. 4.

The self capacitance scales linear with the area, i.e. when the area is doubled the self capacitance is doubled as well. It is important to recognize that this statement is true only when almost no current is flowing, other wise the capacitance will vary because of the nonlinear current distribution across the area.

A correlation between OLED size and capacitance is easy. Usually the capacitance Co of a given size Ao is known so that for a measured capacitance Cm the size is:

$$Am = Ao * Cm/Co.$$

Figure 5:
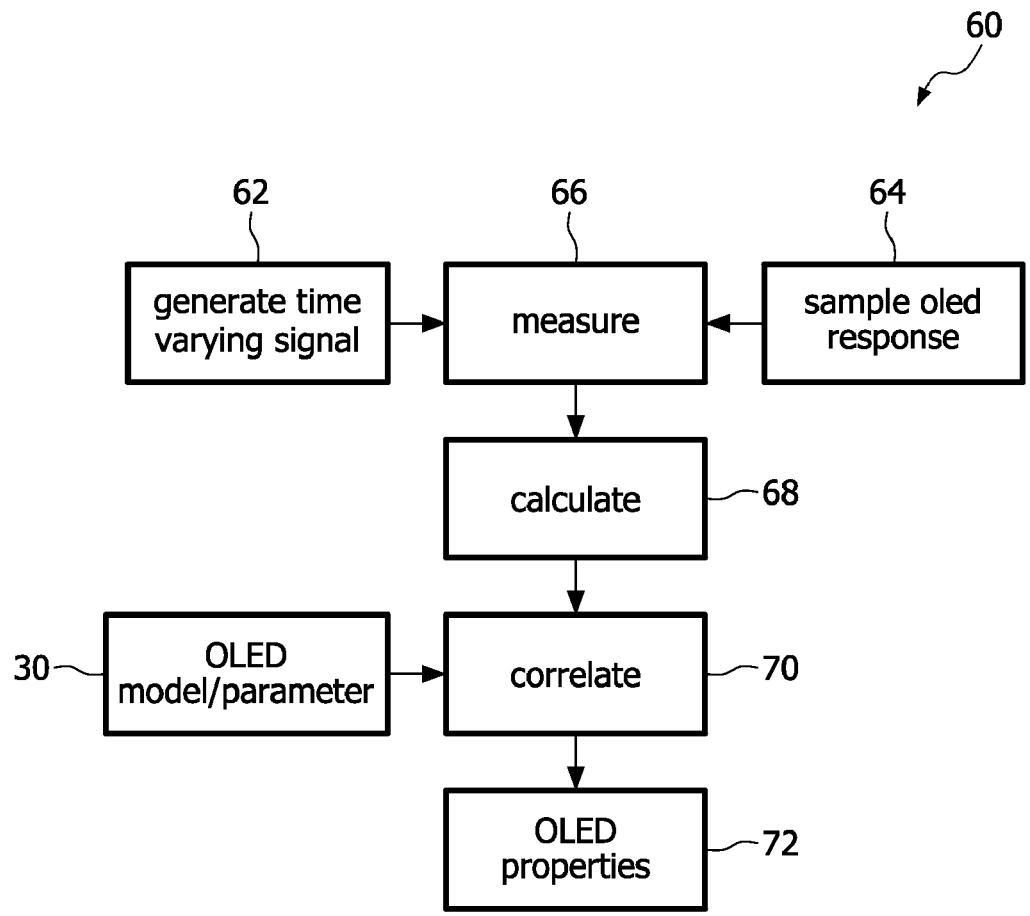
FIG. 5 is a block diagram illustrating steps of the inventive method.

In FIG. 5, the operation of the diagnostic device 20 is schematically shown in form of a block diagram. As already mentioned before, the time signal generator 22 generates time varying signals, block 62. These time varying signals are supplied to the OLED 10 and the response signals of the OLED are measured and sampled, block 64, by the response measuring unit 64. Then, the impedance determining unit calculates the impedance, block, 68 and correlates or matches the calculated values with OLED model parameters stored in a data base 30, block 70. Then having the circuit elements the OLED properties, namely status and/or condition, may be determined, block 72.

To sum up, the inventive method and the diagnostic device described above, relates the status of an LED or OLED device to the response of the LED or OLED to a small time varying signal. The method can be used by an OLED driver controller and/or diagnostic device to detect the status of OLED aging, predict OLED aging, distinguish between various types of aging, identify various types of OLEDs or identify various types of defects.

The proposed method is used by said diagnostic device which may be integrated into the OLED or may be connected as a separate device. The application areas are for example universal drivers. Here, the automatic determination of lamp parameters allows for example to adapt the driver operation to assure constant light output independent of the size of the OLED. Examples are OLED luminaries with a different number of tiles. The number of tiles is automatically detected and the driver adjusts OLED current (scalable driver).

A further application area is aging compensation. Here, the driver adjusts the OLED current to compensate for aging effects which would otherwise degrade the light output (active aging compensation).

A further application area is defect analysis. Here, it is possible to detect defective OLEDs during production.

Last but not least, a further application area is OLED diagnostic. Here, the state of OLEDs may be checked, which can be employed for example in the retail sector: As a customer service in shops or emergency lighting: The lamp status may be checked without operating it.

The invention claimed is:

1. Method for determining a status and/or condition of an LED/OLED device, comprising the steps of:
    applying at least one time varying signal to the LED/OLED device,
    acquiring the response to said at least one time varying signal,
    correlating said response with predetermined values, and
    determining the status/condition on the basis of the correlation result, wherein the step of correlating comprises:
    determining impedance values of said device on the basis of the response;
    matching the impedance values to predetermined model values of an equivalent circuit network of said LED/OLED device, such that the impedance of the circuit network corresponds to the determined impedance value, and
    determining the circuit elements of the matched equivalent circuit network, on the basis of which the status and/or condition being determined.

2. Method of claim 1, wherein said time varying signal is selected from the group consisting of: sinusoidal signal, chirp signal, wide band signal, small band signal, single frequency signal, multi frequency signal, step signal and ramp signal.

3. Method of claim 1, wherein said response is a voltage, current, impedance or conductance.

4. Method of claim 1, wherein said status is at least one of: light efficiency, measure of number of defects, type or size of the LED/OLED.

5. Method of claim 1, wherein said condition is at least one of: aging in relation to expected life time, expected life time or overheating.

6. Method of claim 1, wherein the slope of the IV curve and the impedance of the device is derived from the determined impedance values, the varying signals being ac signals with frequency fm and known current amplitude Im.

7. Method of claim 1, wherein said time varying signal is a signal not being able to operate the LED/OLED device.

8. Diagnostic device for determining a status and/or condition of a LED/OLED unit, comprising
    first means for generating a set of time varying signals and applying them to the LED/OLED unit;
    second means for acquiring the response to said applied signals;
    third means for correlating said response with predetermined values; and
    fourth means for determining the status and/or condition on the basis of the correlation result; wherein said third means comprises means for determining impedance values of said device on the basis of the response;
    means for matching the impedance values to predetermined model values of an equivalent circuit network of said LED/OLED device,
    such that the impedance of the circuit network corresponds to the determined impedance value.

9. Diagnostic device of claim 8, wherein said time varying signals are coupled into the drive signal of a driver circuit coupled with said LED/OLED unit.

10. Diagnostic device of claim 8, comprising a driver circuit for driving said LED/OLED unit, wherein said first means is part of said driver circuit.

11. Diagnostic device of claim 8, wherein said first, second, third and/or fourth means are provided as a microprocessor and/or a PIC (programmable integrated circuit) and/or an ASIC and/or an analog circuit.

12. Diagnostic device of claim 8, wherein said third means are programmable with a local memory.

13. Diagnostic device of claim 8, wherein said first to fourth means are arranged in a distributed manner.

14. Diagnostic device of claim 8, wherein said time varying signals are coupled to a further unit connected with said LED/OLED unit for determining the status and/or condition of said further device.

15. Diagnostic device of claim 14, wherein said further device is a battery supplying electric power to said LED/OLED unit.

* * * * *